United States Patent [19]
Watanabe

[11] Patent Number: 5,801,927
[45] Date of Patent: Sep. 1, 1998

[54] CERAMIC PACKAGE USED FOR SEMICONDUCTOR CHIPS DIFFERENT IN LAYOUT OF BONDING PADS

[75] Inventor: Kazutoshi Watanabe, Tokyo, Japan

[73] Assignee: NEC Corporation, Japan

[21] Appl. No.: 701,232

[22] Filed: Aug. 21, 1996

[30] Foreign Application Priority Data

Aug. 30, 1995 [JP] Japan ................................. 7-221876

[51] Int. Cl.$^6$ ................................................. H05K 7/06
[52] U.S. Cl. ..................... 361/777; 361/764; 361/820; 257/692; 257/786; 174/261
[58] Field of Search .......................... 361/772, 777, 361/820, 764; 174/261; 257/692, 700, 786

[56] References Cited

U.S. PATENT DOCUMENTS 3,716,761  2/1973  Rotast ............................... 361/777
4,489,365  12/1984  Daberkoe ........................... 361/777

Primary Examiner—Michael W. Phillips
Assistant Examiner—John B. Vigushin
Attorney, Agent, or Firm—Hayes, Soloway, Hennessey, Grossman & Hage, P.C.

[57] ABSTRACT

A ceramic case includes a plurality of stitches divided into a central sub-group shared between different kinds of semiconductor chips and side sub-groups selectively used for the different kinds of semiconductor chip, and the side sub-groups enhance the compatibility of the ceramic case.

4 Claims, 4 Drawing Sheets

5,801,927

CERAMIC PACKAGE USED FOR SEMICONDUCTOR CHIPS DIFFERENT IN LAYOUT OF BONDING PADS

FIELD OF THE INVENTION

This invention relates to a ceramic package forming a part of a semiconductor integrated circuit and, more particularly, to a ceramic package available for plural kinds of semiconductor chips different in layout of bonding pads.

DESCRIPTION OF THE RELATED ART

After separation of a semiconductor wafer into chips, each of the semiconductor chips is sealed in a package before delivery to a purchaser. Various kinds of package are known. An integrated circuit is fabricated on the semiconductor chip, and is terminated at bonding pads. The layout of the bonding pads is dependent upon the integrated circuit, and, for this reason, there are also various kinds of semiconductor chip.

FIG. 1 illustrates a ceramic package 1 for a semiconductor chip 2. The ceramic package 1 has a recess 1a assigned to the semiconductor chip 2, and the semiconductor chip 2 is accommodated in the recess 1a. An array of conductive stitches 1b is formed on the peripheral area around the recess 1a, and the conductive stitches 1b are electrically connected to a pin array or a ball grid array, respectively.

On the other hand, the semiconductor chip 2 has a large number of bonding pads 2a arranged along the periphery at relatively short intervals, and the bonding pads 2a are respectively connected to the conductive stitches 1b by means of bonding wires 3.

The bonding pads 2a are divided into four groups corresponding to the four groups of the conductive stitches 1b, respectively. The bonding pads 2a of each group are arranged in two lines, and the bonding pads 2a on one line are staggered to the bonding pads 2a on the other line. The layout of the bonding pads 2a is hereinbelow referred to as "staggered bonding pad array".

The conductive stitches 1b are divided into four groups, and the four groups of conductive stitches 1b are respectively corresponding to the four groups of bonding pads 1b. The conductive stitches 1b of each group are arranged in two rows, and the conductive stitches 1b on one line are staggered to the conductive stitches 1b on the other line. The conductive stitches 1b of each group are opposed to the bonding pads 2a of the corresponding group in such a manner that the bonding wires 3 are parallel to one another.

A problem is encountered in the prior art ceramic package 1 in compatibility. If a large semiconductor chip 4 has a bonding pads 4a looped along the periphery thereof at relatively long intervals, the bonding wires 3 are liable to be short-circuited as shown in FIG. 2. The group of conductive stitches 1b is narrower than the conductive pads 4a along the corresponding edge of the semiconductor chip 4, and the bonding wires 3 for the conductive stitches 1ba, 1bb, 1bc and 1bd outwardly decline with respect to the bonding wire 3 for the conductive stitch 1be at the center of the group. As a result, the bonding wires for the conductive stitches 1ba to 1bd are held in contact with the bonding wires 3 for the conductive stitches 1bf, 1bg, 1bh and 1bi. Thus, the ceramic package 1 is only available for the small semiconductor chip 2, and the large semiconductor chip 4 is mounted on another ceramic package. The layout of the bonding pads 4a is hereinbelow referred to as "single looped bonding pad array".

SUMMARY OF THE INVENTION

It is therefore an important object of the present invention to provide a ceramic package available for not only a small semiconductor chip with a staggered bonding pad array but also a large semiconductor chip with a single looped bonding pad array.

To accomplish the object, the present invention proposes to form a group of conductive stitches by central conductive stitches shared between different kinds, of semiconductor chip and side conductive stitches selectively used for the different kinds of semiconductor chip.

In accordance with the present invention, there is provided an insulating package for mounting one of different kinds of semiconductor chip thereon, comprising: a first area assigned to the different kinds of semiconductor chip; a second area contiguous to the first area; and a plurality of conductive stitches formed on the second area, and divided into a first group shared between the different kinds of semiconductor chip for forming electrical paths between the aforesaid one of different kinds of semiconductor chip and an external electrical component and second groups provided on both sides of the first group and selectively used for the different kinds of semiconductor chip so as to form other electrical paths between the aforesaid one of different kinds of semiconductor chip and the external electrical component.

The insulating package may be formed of ceramic.

BRIEF DESCRIPTION OF THE DRAWINGS

The features and advantages the ceramic package according to the present invention will be more clearly understood from the following description taken in conjunction with the accompanying drawings in which.

DESCRIPTION OF THE PREFERRED EMBODIMENT

Figure 1:
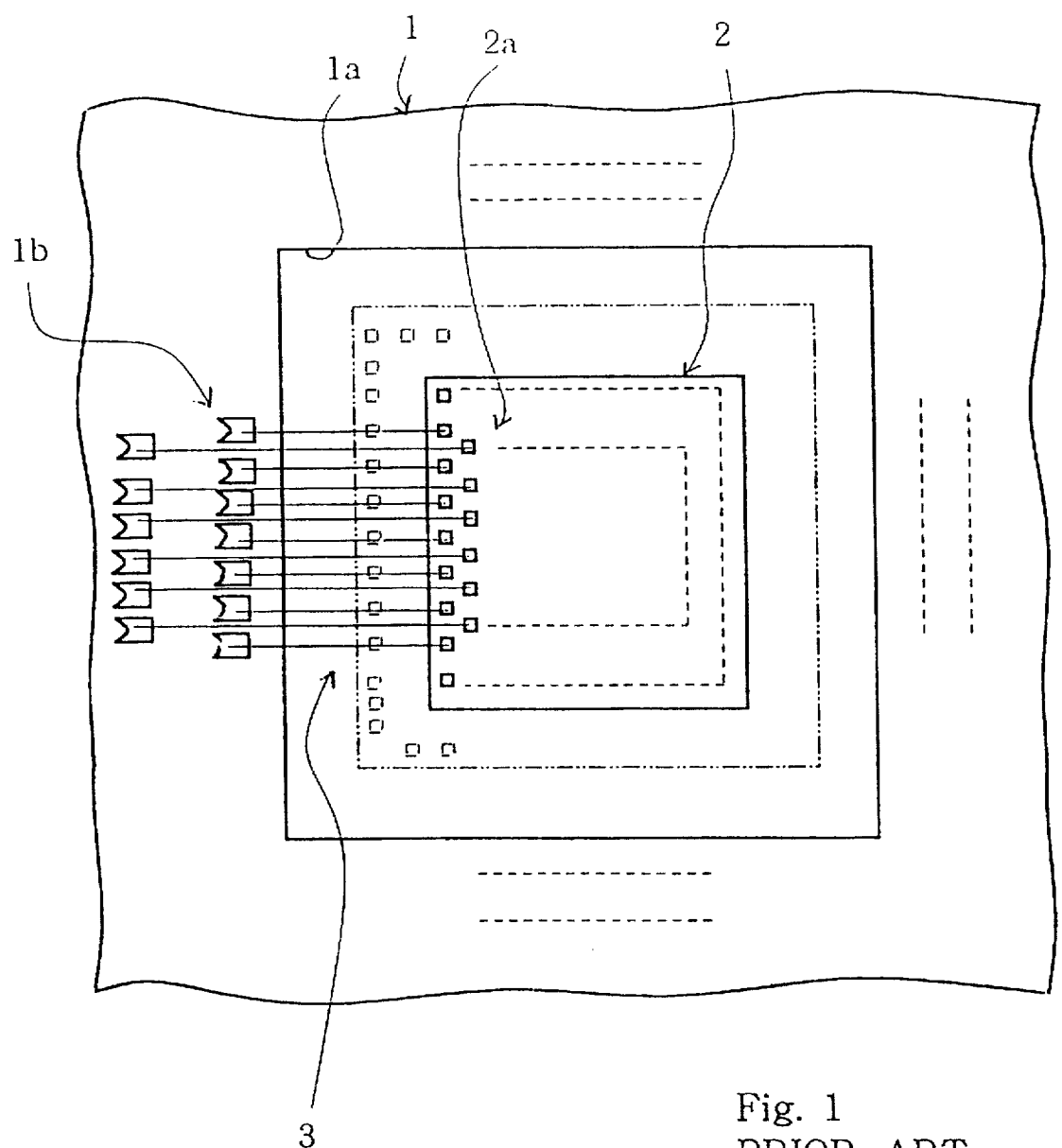
FIG. 1 is a plan view showing the prior art ceramic package used for the semiconductor chip with the staggered bonding pad array.
Figure 2:
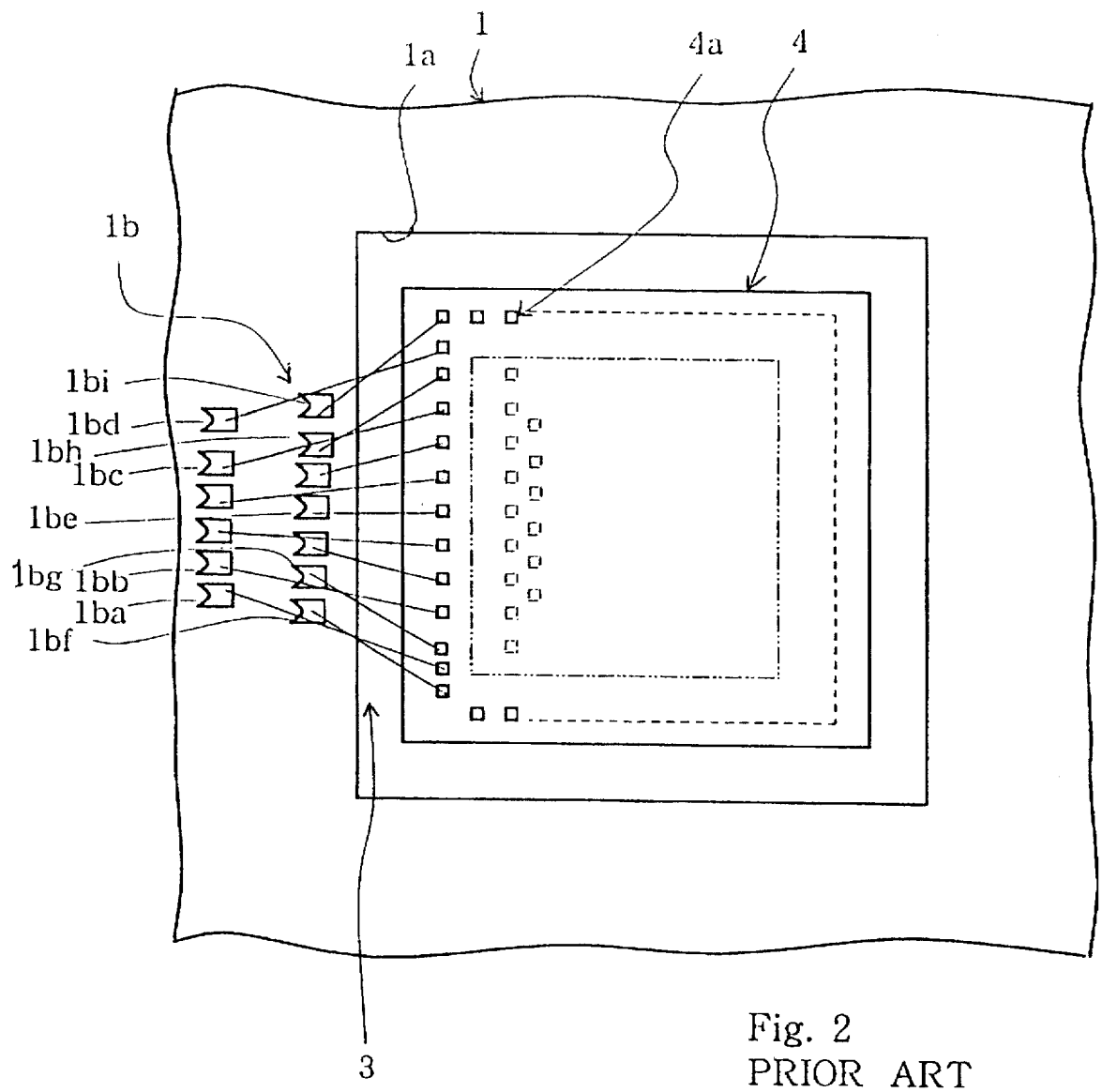
FIG. 2 is a plan view showing the semiconductor chip with the single looped bonding pad array mounted on the prior art ceramic package.
Figure 3:
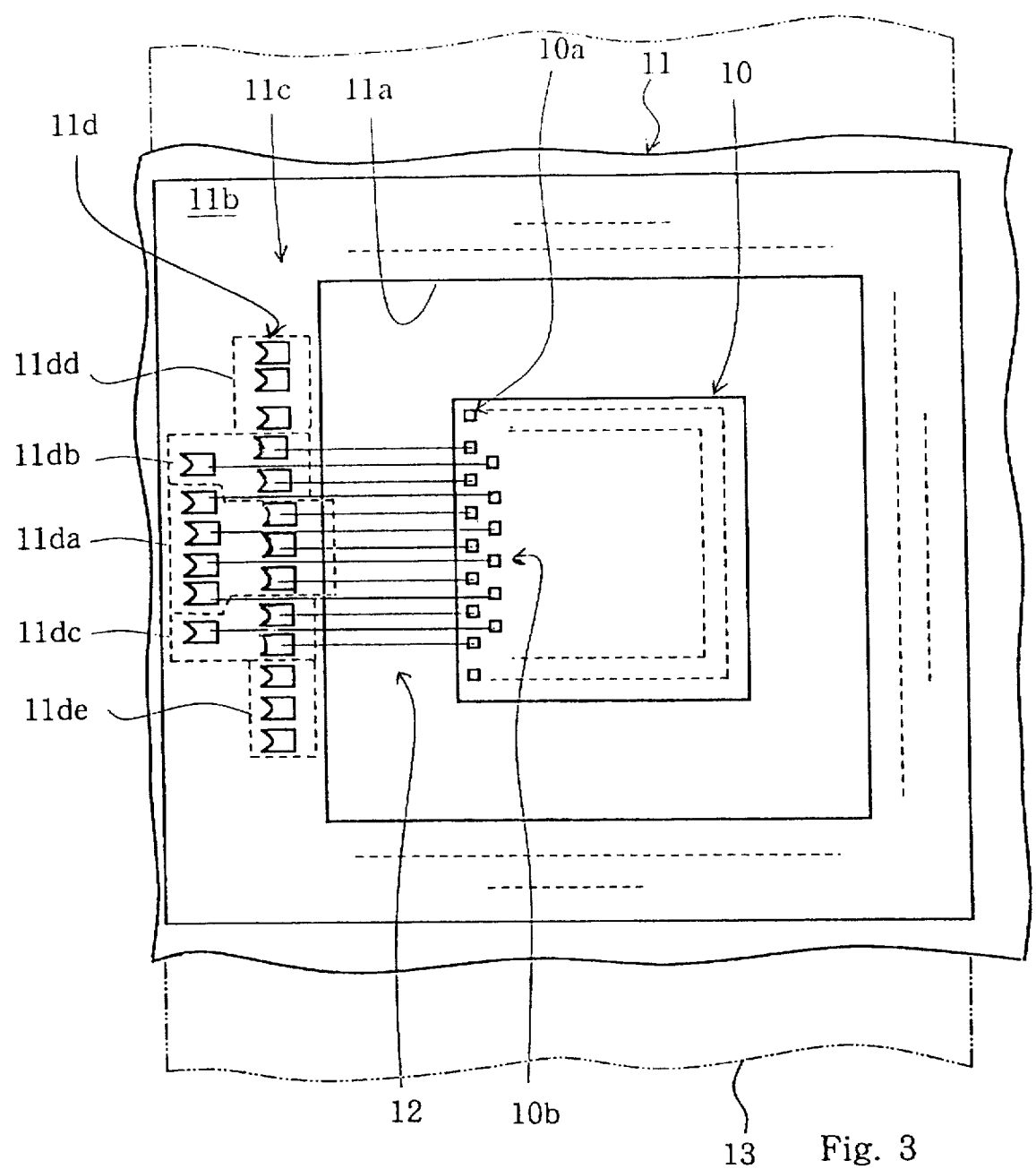
FIG. 3 is a plan view showing a ceramic package on which a semiconductor chip with a staggered bonding pad array according to the present invention.

Referring first to FIG. 3 of the drawings, a semiconductor chip 10 is mounted on a ceramic case 11 of a ceramic package embodying the present invention. Though not shown in the drawings, an integrated circuit is fabricated on the semiconductor chip 10, and is terminated at bonding pads 10a. The semiconductor chip 10 is a square shape, and the bonding pads 10a are provided on the periphery of the semiconductor chip 10. The bonding pads 10a are arranged in the staggered bonding pad array, and are divided into four groups. The four groups of the bonding pads 10a are respectively opposed to the four edges of the square chip 10.

On the other hand, the ceramic case 11 has a center square recess 11a, and the semiconductor chip 10 is mounted on the bottom surface of the square recess 11a. A frame-like area 11b defines the peripheral edges of the recess 11a, and is assigned to conductive stitches 11c. The bottom surface of the square recess 11a and the frame-like area 11b serve as the first area and the second area, respectively.

The conductive stitches 11c are divided into four groups, and the four groups of the conductive stitches 11c are respectively associated with the four groups of the bonding pads 10a. Only one group of conductive stitches 11d is shown in FIG. 3 together with the associated group of bonding pads 10b.

The group of conductive stitches 11d is further divided into a central sub-group 11da shared between the semiconductor chip 10 and other semiconductor chips and side sub-groups 11db/11dc and 11dd/11de provided on both sides of the central sub-group 11da. The side sub-groups 11db/11dc and 11dd/11de are selectively used for the semiconductor chip 10 and the other semiconductor chips. In this instance, the side sub-groups 11db ad 11dc are used for the semiconductor chip 10, and the conductive stitches of the central sub-group 11da and the conductive stitches of the side sub-groups 11db/11dc are connected to the bonding pads of the associated group 10b by means of conductive bonding wires 12, respectively. The central sub-group 11da and the side sub-groups 11db/11dc and 11dd/11de serve as the first group and the second groups, respectively.

Though not shown in FIG. 3, the conductive stitches of the central sub-group 11da and the conductive stitches of the side sub-groups 11db/11dc are respectively connected to pins or balls, and the conductive stitches of the side sub-groups 11dd/11de are connected through conductive layers of a laminated structure of the ceramic case 11 to the pins or the balls for the conductive stitches of the side sub-groups 11db/11dc, respectively. In other words, the predetermined pins/balls are shared between the side sub-groups 11db/11dc and the side sub-groups 11dd/11de. The pins/balls are selectively connected to conductive wirings 13 formed on a circuit board, and, for this reason, the conductive stitches 11c are electrically connected through the pins/balls to the conductive wirings 13. Power voltages and electric signals are transferred between the conductive wirings 13 on the circuit board and the semiconductor chip 10 through the conductive layers of the laminated structure of the ceramic case 11, the stitches 11c and the bonding wires 12. The conductive wirings 13 serve as the external electrical component.

The ceramic case is assembled with a cap (not shown), and the conductive stitches 11c and the semiconductor chip 10 are sealed in the ceramic package.

Figure 4:
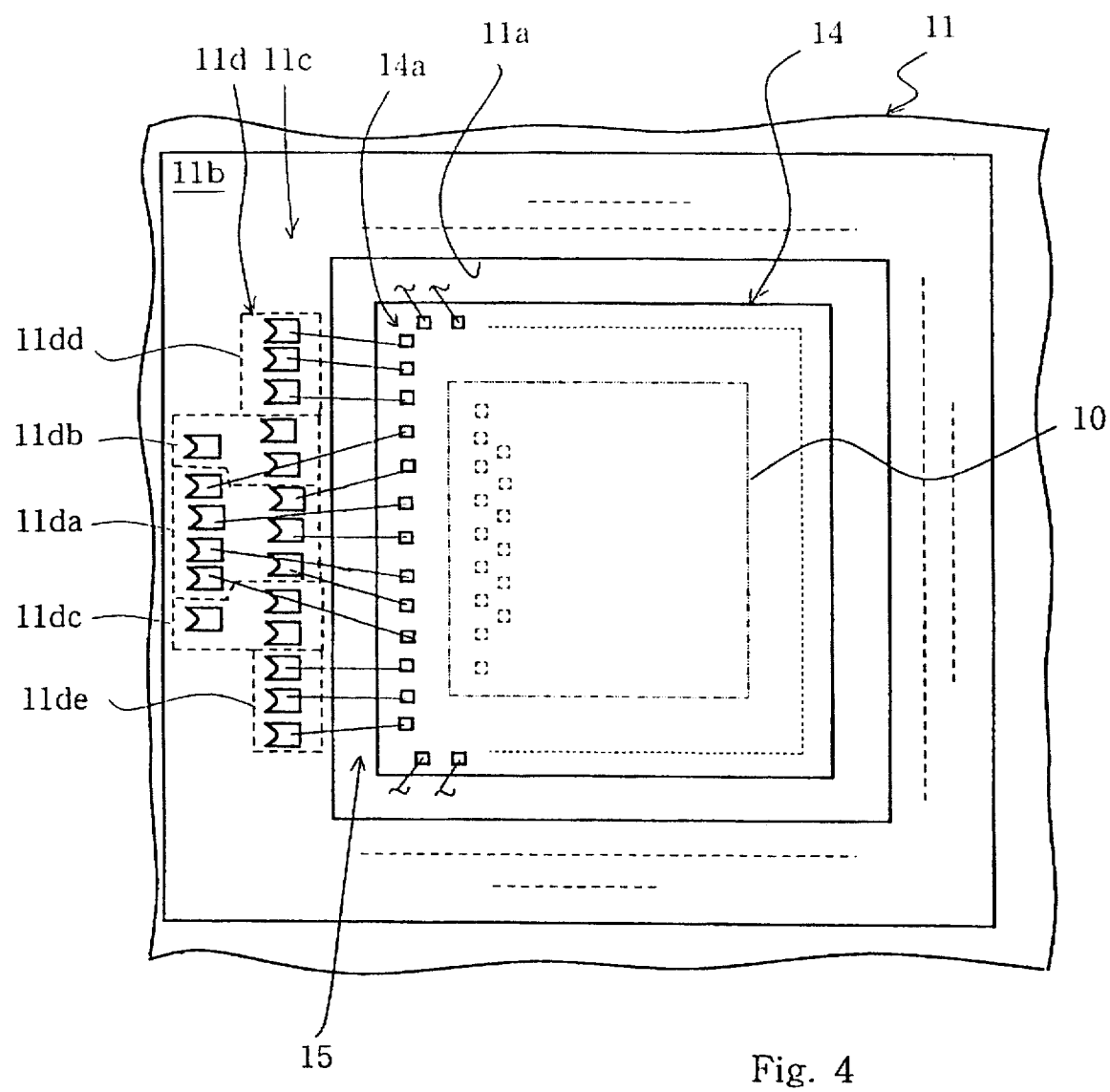
FIG. 4 is a plan view showing a semiconductor chip with a single looped bonding pad array mounted on the ceramic package according to the present invention.

When the ceramic package is used for another semiconductor chip 14 with the single looped bonding pad array, the semiconductor chip 14 is mounted on the bottom surface of the recess 11a, and the central sub-group 11da and the side sub-groups 11dd and 11de are used for electrical connections to the bonding pads 14a arranged in the single loop along the periphery of the square semiconductor chip 14 as shown in FIG. 4.

The conductive stitches of the central/side sub-groups 11da and 11dd/11de are connected to the bonding pads 14a arranged along one edge of the semiconductor chip 14 by means of conductive bonding wires 15, respectively. However, the side sub-groups 11db and 11dc stand idle. The conductive stitches of the side sub-groups 11dd/11de are positioned outside of the conductive bonding wires for the conductive stitches of the central sub-group 11da, and a short-circuit never takes place.

In this instance, the pitch of the single looped bonding pad array 14a ranges from 150 microns to 200 microns, and the pitch of the staggered bonding pad array 10a falls within the range between 60 microns to 100 microns. The pitch of the conductive stitches 11c is constant, and ranges from 60 microns to 100 microns.

As will be appreciated from the foregoing description, the side sub-groups 11db/11dc and the side sub-groups 11dd/11de are selectively used for the electrical connection to the semiconductor chip 10 or 14, and are laterally spaced. For this reason, the ceramic package according to the present invention is available for different kinds of semiconductor chip, and the compatibility of the ceramic package is surely enhanced.

Although a particular embodiment of the present invention has been shown and described, it will be obvious to those skilled in the art that various changes and modifications may be made without departing from the spirit and scope of the present invention.

For example, more than two sub-groups may be provided on each side of the central group. In this instance, more than two kinds of semiconductor chip shares the ceramic package according to the present invention, and the compatibility is further enhanced.

What is claimed is:

1. An insulating package for mounting one of different kinds of semiconductor chip thereon, comprising:

a first area formed in a central area of a ceramic body, and assigned to said different kinds of semiconductor chip, said first area comprising a rectangular recess;

a second area provided on said ceramic body, and extending along a periphery of said rectangular recess so as to be contiguous to said first area; and a plurality of conductive stitches formed on said second area, and divided into a first group shared between said different kinds of semiconductor chip for forming electrical paths between said one of different kinds of semiconductor chip and an external electrical component and second groups provided on both sides of said first group and selectively used for said different kinds of semiconductor chip so as to form other electrical paths between said one of different kinds of semiconductor chip and said external electrical component.

2. The insulating package as set forth in claim 1, in which said first group is positioned in a central portion of one of four sub-areas of said second area opposite to one of four edges forming said periphery, and said second groups includes first and second side groups provided on both first side areas of said central portion and third and fourth side groups provided on both second side areas of said first side areas, said first and second side groups being electrically connected to said third and fourth side groups, respectively, so as to selectively use said first and second side groups and said third and fourth side groups for said different kinds of semiconductor chips.

3. The insulating package as set forth in claim 2, further comprising three sets of conductive stitches respectively provided in three of said four sub-areas, and each set of conductive stitches is similar to said plurality of conductive stitches divided into said first group and said second groups.

4. The insulating package as set forth in claim 2, in which said first group and one of said first and second side groups and said third and fourth side groups are connected by conductive bonding wires to said one of said different kinds of semiconductor chip.

* * * * *